(12) United States Patent
Tseng et al.

(10) Patent No.: US 7,946,859 B1
(45) Date of Patent: May 24, 2011

(54) ETHERNET ADAPTOR

(75) Inventors: Yu-Ming Tseng, Hsinchu (TW);
Chin-Chun Wen, Hsinchu (TW)

(73) Assignee: Netronix, Inc., Hsinchu (TW)

( * ) Notice: Subject to any disclaimer, the term of this patent is extended or adjusted under 35 U.S.C. 154(b) by 0 days.

(21) Appl. No.: 12/915,417

(22) Filed: Oct. 29, 2010

(51) Int. Cl.
*H01R 12/00* (2006.01)

(52) U.S. Cl. ........................................ 439/76.1; 439/676

(58) Field of Classification Search .................. 439/676, 439/76.1
See application file for complete search history.

(56) References Cited

U.S. PATENT DOCUMENTS

| | | | | |
|---|---|---|---|---|
| 5,091,826 A | * | 2/1992 | Arnett et al. | 439/676 |
| 5,314,357 A | * | 5/1994 | Weidler | 439/701 |
| 5,406,450 A | * | 4/1995 | Shieh | 439/638 |
| 6,159,022 A | * | 12/2000 | Tsai | 439/76.1 |
| 6,537,085 B2 | * | 3/2003 | Na | 439/76.1 |
| 7,184,273 B2 | * | 2/2007 | Sakai | 361/752 |
| 2002/0039284 A1 | * | 4/2002 | Hsu | 361/737 |
| 2003/0133273 A1 | * | 7/2003 | Nagaoka | 361/752 |

* cited by examiner

*Primary Examiner* — Briggitte R Hammond
(74) *Attorney, Agent, or Firm* — Rosenberg, Klein & Lee

(57) ABSTRACT

An Ethernet adaptor comprises a box having an upper and a lower covers, a female connector and a circuit board. The upper cover includes an upper opening having a female press-fit element on the side wall, and two upper positioning ribs in the interior. The lower cover includes a lower opening having two positioning protrusions on a lower edge, and two lower positioning ribs in the interior. The upper opening, lower opening, upper positioning ribs and lower positioning ribs form a through-hole. The female connector is accommodated in the through-hole and includes an L-shape body. The bottom of the L-shape body has positioning notches corresponding to the positioning protrusions. An outward-facing surface of a vertical portion of the L-shape body has two positioning members. An inward-facing surface of the vertical portion extends through the through-hole to the interior of the box to connect with the circuit board inside the box.

4 Claims, 6 Drawing Sheets

ETHERNET ADAPTOR

BACKGROUND OF THE INVENTION

1. Field of the Invention

The present invention relates to an Ethernet adaptor, particularly to a thinner and lighter Ethernet adaptor.

2. Description of the Related Art

At present, the signal of an Ethernet adaptor is transmitted to a network device at most 100 meters away via a male RJ45 connector. Refer to FIG. 1 for the structure of a conventional Ethernet adaptor. The conventional Ethernet adaptor 10 comprises a body 12, a circuit board 14 arranged inside the body 12, and a rectangular through-hole 16 formed on the body 12 to receive a standard female RJ45 connector 18 (shown in FIG. 1a). The female RJ45 connector 18 includes a rectangular casing 20 corresponding to the rectangular through-hole 16. The casing 20 has a stepped opening 22 and a group of terminals 24 arranged inside the opening 22. As shown in FIG. 1, a male RJ45 connector 26 is snap-fitted to the opening 22 and electrically connected with the circuit board 14 via the terminals 24.

However, the thickness a of such a conventional Ethernet adaptor 10 is hard to have a smaller value because of the structural factors of the female RJ45 connector 18 and the body 12.

Accordingly, the present invention proposes a novel Ethernet adaptor to overcome the abovementioned problem.

SUMMARY OF THE INVENTION

The primary objective of the present invention is to provide an Ethernet adaptor, wherein a box skillfully replaces a portion of the structure of the conventional female connector, whereby is effectively reduced the overall thickness of the Ethernet adaptor.

To achieve the abovementioned objective, the present invention proposes an Ethernet adaptor, which is to engage with a male connector, and which comprises a box having an upper cover and a lower cover, a female connector and a circuit board.

The side wall of the upper cover has an upper opening. Two upper positioning ribs are respectively arranged on two sides of the interior of the upper opening. The upper opening has a female press-fit element where a male press-fit element of a male connector is press-fitted. The side wall of the lower cover has a lower opening. Two positioning protrusions are respectively arranged on two sides of the lower edge of the lower opening. Two lower positioning ribs are respectively arranged on two sides of the interior of the lower opening. The upper and lower openings and the upper and lower positioning ribs jointly form a through-hole interconnecting the exterior and the interior and accommodating the female connector. The female connector includes an L-shape body and terminals arranged in the L-shape body. The bottom of the L-shape body has two positioning notches corresponding to the positioning protrusions. The vertical portion of the L-shape body has two positioning members at two sides of the outward-facing surface thereof. The positioning members prop against the upper positioning ribs and lower positioning ribs. The inward-facing surface of the vertical portion of the L-shape body extends through the through-hole to the interior of the box to connect with the circuit board arranged inside the box.

Below, the embodiments are described in detail in cooperation with the drawings to make easily understood the technical contents, characteristics and accomplishments of the present invention.

DETAILED DESCRIPTION OF THE INVENTION

The present invention proposes a novel Ethernet adaptor to overcome the problem that the conventional Ethernet adaptor connecting with a male connector is hard to have a smaller thickness. The spirit of the present invention is skillfully transferring a portion of the structure of the conventional rectangular female connector to a box structure to reduce the thickness and weight of the Ethernet adaptor.

The male connector mentioned in the specification is a conventional technology. Therefore, the specification does not depict the detailed structure of the male connector but only describes the portion related to the present invention.

Figures 1, 1A:
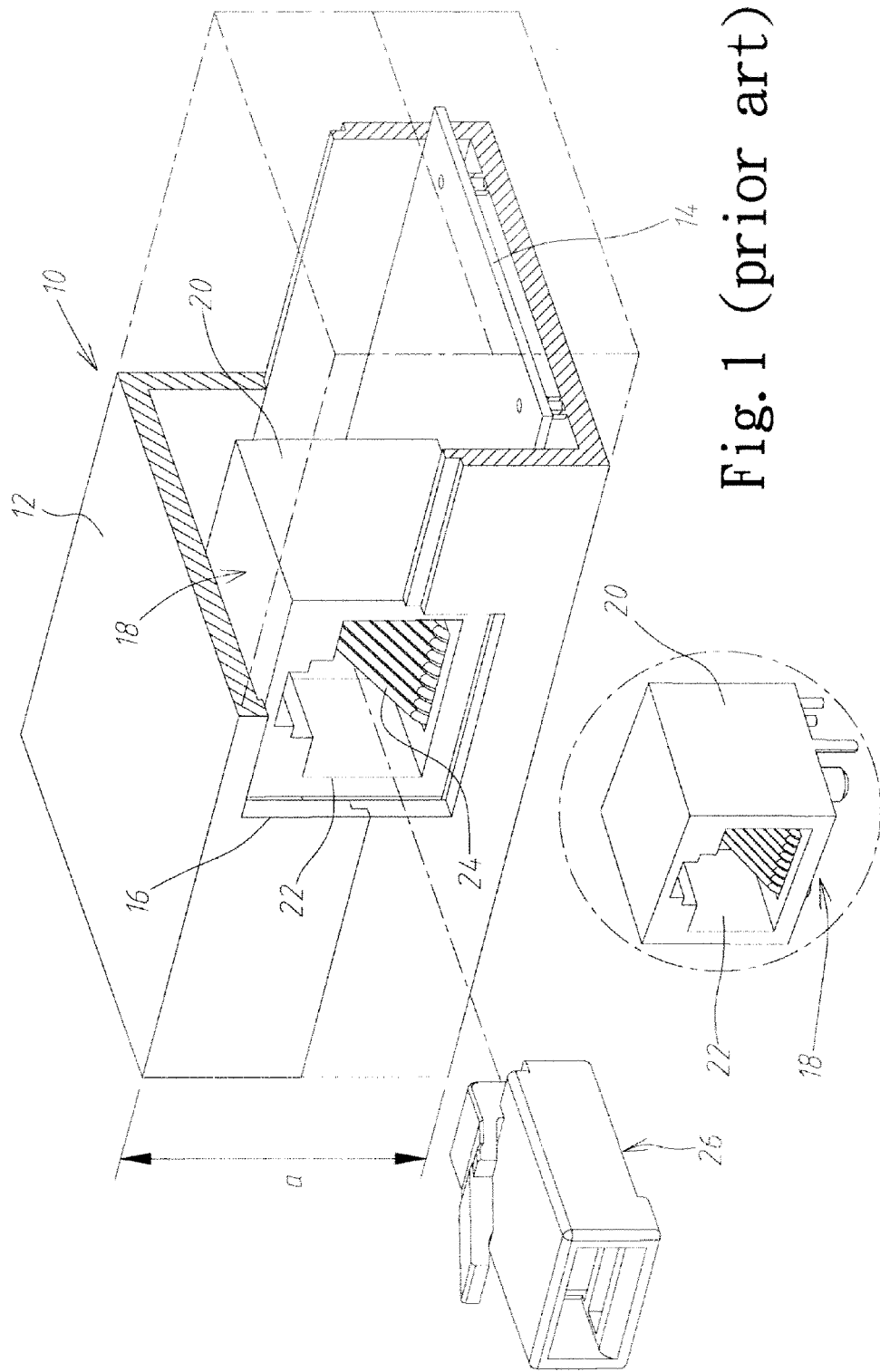
FIG. 1 is a diagram schematically showing the structure of a conventional Ethernet adaptor.
FIG. 1a is a diagram schematically showing the structure of a conventional female connector.
Figure 2:
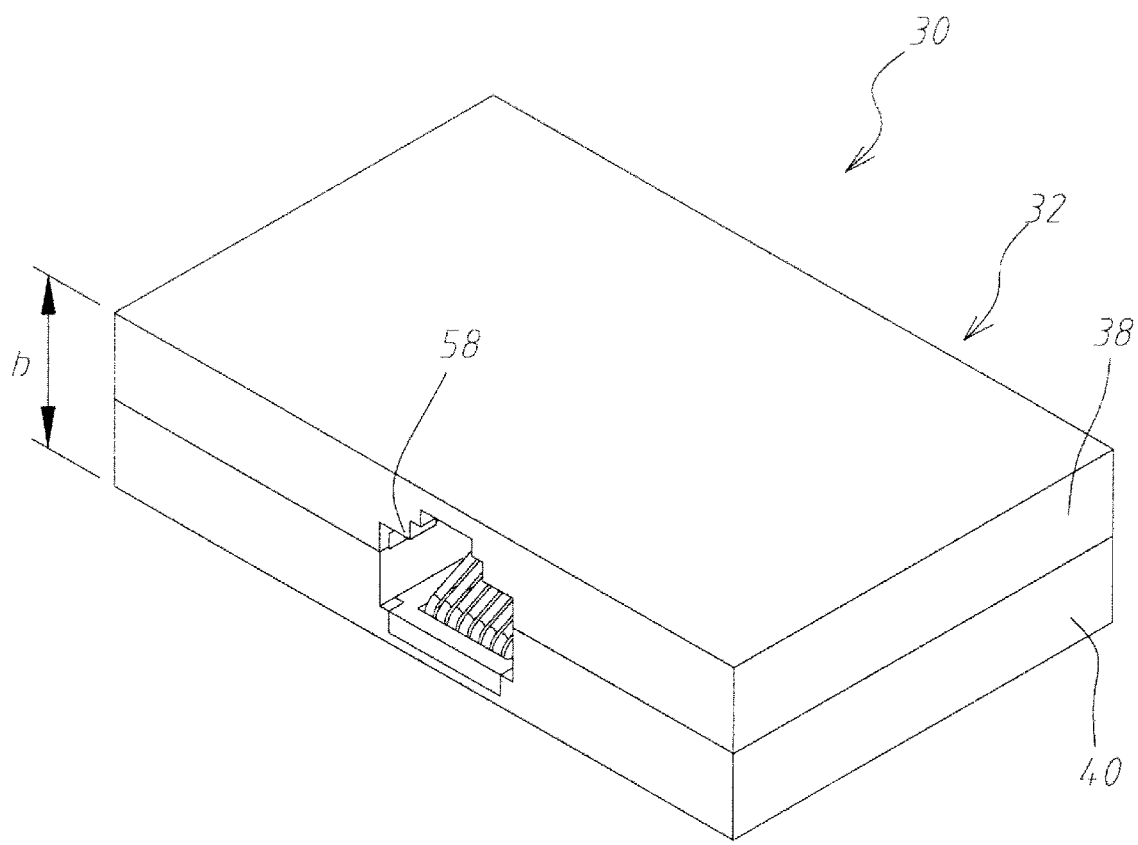
FIG. 2 is a perspective view schematically showing an Ethernet adaptor according to one embodiment of the present invention.
Figure 3:
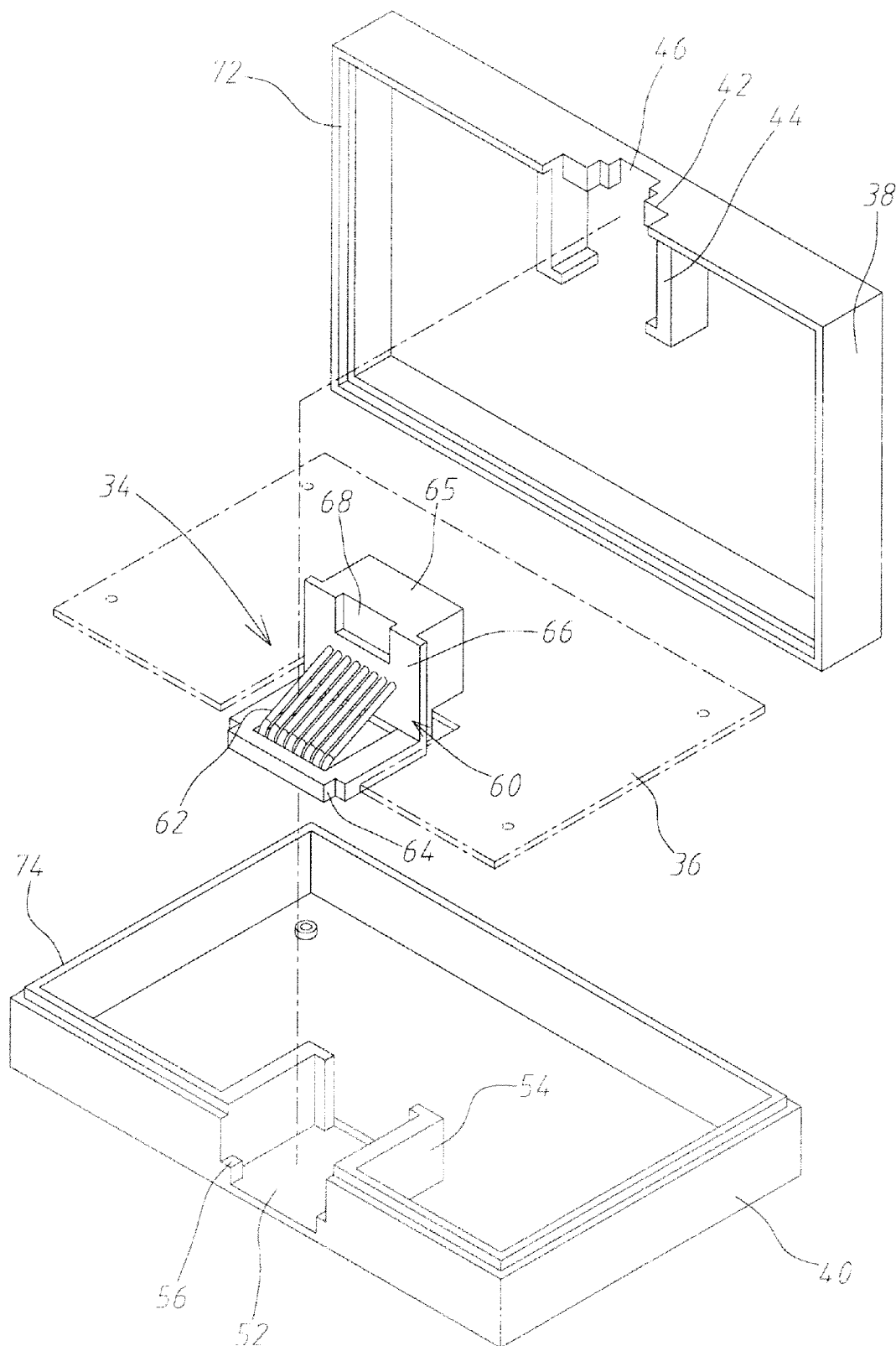
FIG. 3 is an exploded view schematically showing an Ethernet adaptor according to one embodiment of the present invention.
Figure 4:
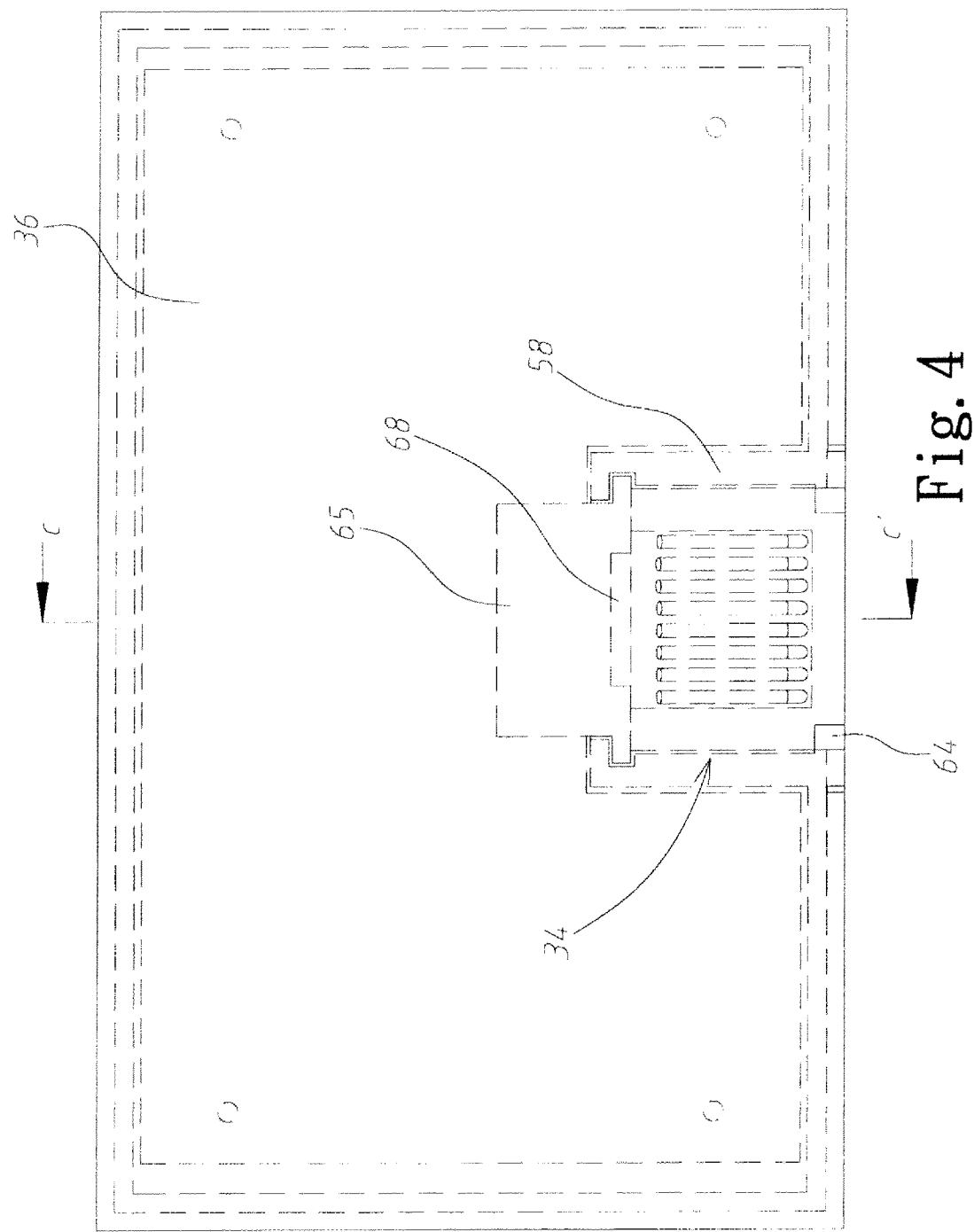
FIG. 4 is a top view schematically showing an Ethernet adaptor according to one embodiment of the present invention.
Figure 5:
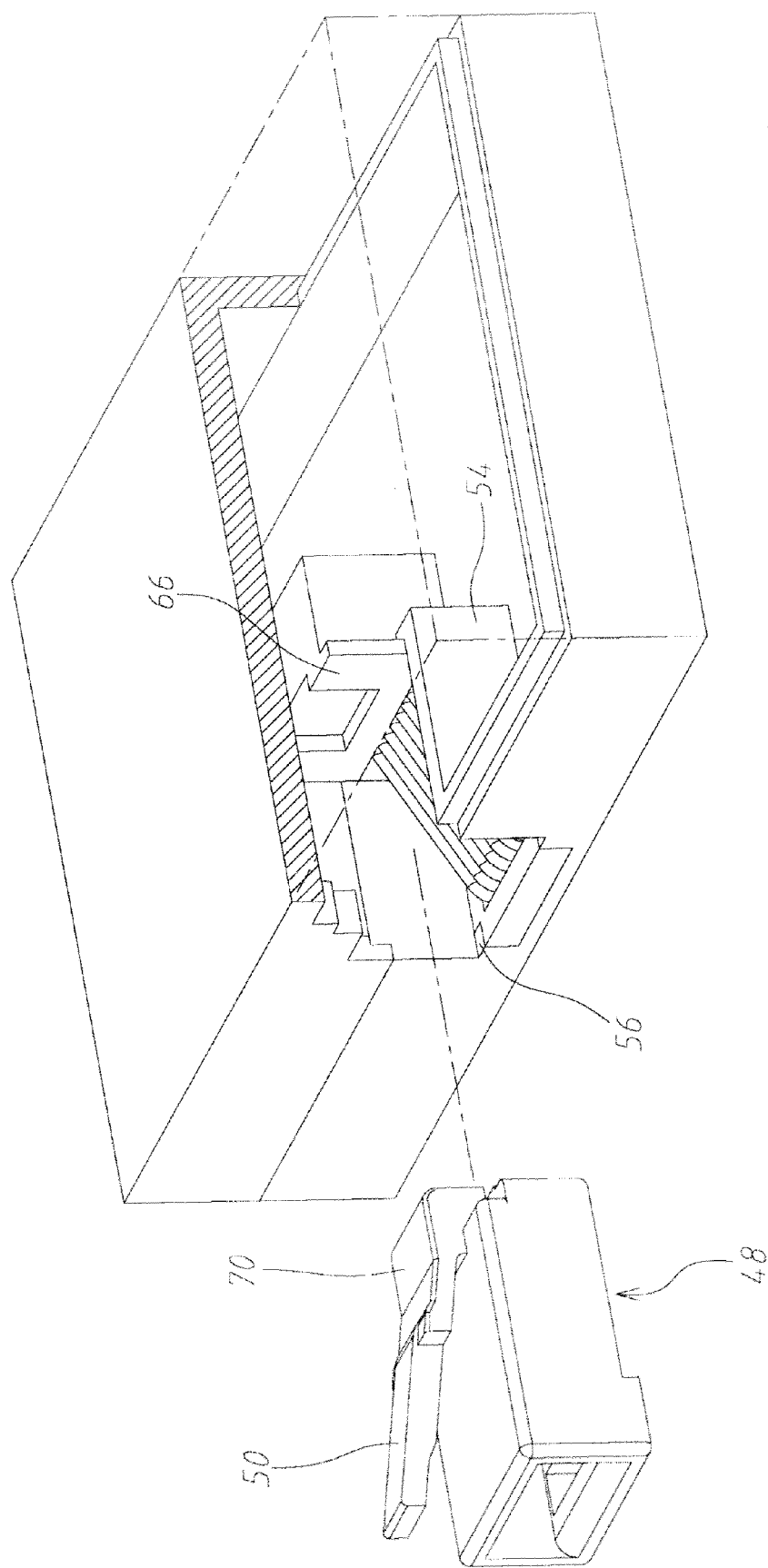
FIG. 5 is a diagram schematically showing the engagement of a male connector and an Ethernet adaptor according to one embodiment of the present invention.
Figure 6:
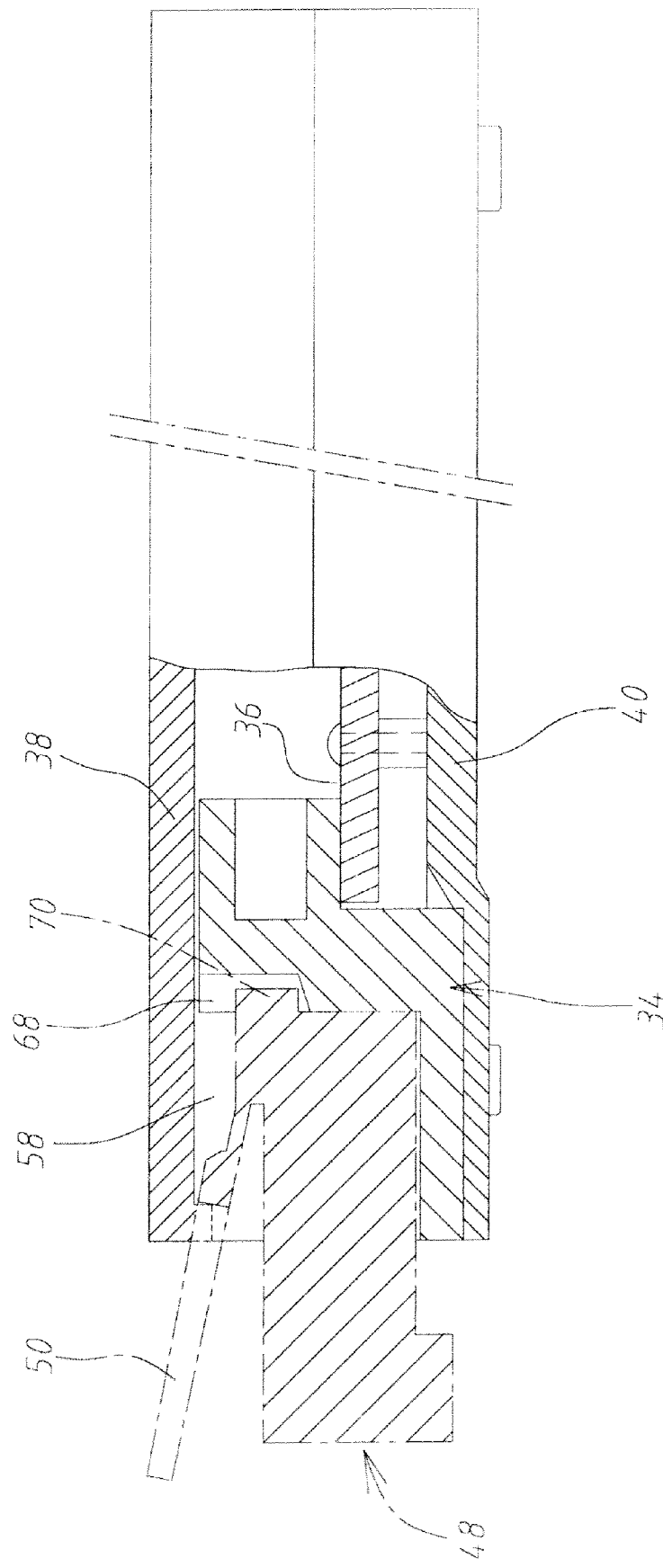
FIG. 6 is a sectional view taken along Line C-C' in FIG. 4.

Refer to FIGS. 2-6. FIGS. 2-4 are respectively a perspective view, an exploded view and a top view schematically showing an Ethernet adaptor according to the present invention. FIG. 5 is a diagram schematically showing the engagement of a male connector and an Ethernet adaptor according to one embodiment of the present invention. FIG. 6 is a sectional view taken along Line C-C' in FIG. 4.

As shown in the drawings, the Ethernet adaptor 30 of the present invention comprises a box 32, a female connector 34 and a circuit board 36. The box 32 includes an upper cover 38 and a lower cover 40. The side wall of the upper cover 38 has an upper opening 42. Two upper positioning ribs 44 are respectively arranged on two sides of the interior of the upper opening 42. The upper opening 42 also has a female press-fit element 46 where a male press-fit element 50 of a male connector 48 is press-fitted. The side wall of the lower cover 40 has a lower opening 52. Two lower positioning ribs 54 are respectively arranged on two sides of the interior of the lower opening 52. Two positioning protrusions 56 are respectively arranged on two sides of the lower edge of the lower opening 52. The upper and lower openings 42 and 52 and the upper and lower positioning ribs 44 and 54 jointly form a through-hole 58 interconnecting the exterior and the interior.

The female connector 34 is accommodated in the through-hole 58 and includes an L-shape body 60 and terminals 62 arranged in the L-shape body 60 with two ends of each terminal 62 being exposed. The bottom of the body 60 has two positioning notches 64 corresponding to the positioning protrusions 56. The vertical portion 65 of the L-shape body 60 has two positioning members 66 at two sides of the outward-facing surface thereof. The positioning members 66 prop against the upper positioning ribs 44 and lower positioning ribs 54. The inward-facing surface of the vertical portion 65 of the L-shape body 60 extends through the through-hole 58 to the interior of the box 32. The arrangement of the terminals 62 is identical to that of the conventional female RJ45 connector. Therefore, the female connector 34 and the male connector 48 belong to the RJ45 type.

The circuit board 36 is arranged inside the box 32. The ends of terminals 62 contact the circuit board 36 via the bottom of the vertical portion 65 of the L-shape body 60, which extends through through-hole 58 to the interior of the box 32. Thereby, the terminals 62 are electrically connected with the circuit board 36.

Refer to FIG. 6. The vertical portion 65 of the L-shape body 60 has an opening 68 receiving a protruding portion 70 of the male press-fit element 50 of the male connector 48. The rims of the upper cover 38 and lower cover 40 respectively have snap-fit elements 72 and 74 corresponding to each other, whereby the upper cover 38 and lower cover 40 can be precisely snap-fitted to each other, as shown in FIG. 3.

In the Ethernet adaptor 30 of the present invention, the upper and lower openings 42 and 52 and the upper and lower positioning ribs 44 and 54 jointly form the through-hole 58 interconnecting the exterior and the interior. The through-hole 58 cooperates with the positioning protrusions 56 arranged on two sides of the lower edge of the lower opening 52 to secure the female connector 34. Further, the male press-fit element 50 of the male connector 48 is press-fitted to the female press-fit element 46 in the upper opening 42 to securely engage the male connector 48 with the female connector 34.

In the present invention, a box provides a female press-fit element that the male press-fit element of a male connector needs. Further, the present invention uses positioning protrusions to skillfully secure a female connector in a through-hole. Thereby is obviously reduced the thickness b of the Ethernet adaptor. Thus, the Ethernet adaptor is slimmed and lightweighted.

The embodiments described above are only to exemplify the present invention but not to limit the scope of the present invention. Any equivalent modification or variation according to the spirit or characteristics of the present invention is to be also included within the scope of the present invention.

What is claimed is:

1. An Ethernet adaptor, which is connected with a male connector, comprising an upper cover having an upper opening on a side wall thereof, two upper positioning ribs arranged in two sides of interior of said upper opening, and a female press-fit element press-fitted with a male press-fit element of said male connector;

a lower cover engaged with said upper cover to form a box, and having a lower opening on a side wall thereof, two positioning protrusions respectively arranged on two sides of a lower edge of said lower opening, and two lower positioning ribs arranged in two sides of interior of said lower opening, wherein said upper opening, said lower opening, said upper positioning ribs and said lower positioning ribs jointly form a through-hole interconnecting interior and exterior;

a female connector accommodated in said through-hole, and including an L-shape body and a group of terminals arranged in said L-shape body, wherein a bottom of said L-shape body has two positioning notches corresponding to said positioning protrusions, and wherein two sides of an outward-facing surface of a vertical portion of said L-shape body respectively have positioning members propping against said upper positioning ribs and said lower positioning ribs, and wherein an inward-facing surface of said vertical portion of said L-shape body extends through said through-hole to interior of said box; and a circuit board accommodated in said box and connected with said inward-facing surface of said vertical portion of said L-shape body.

2. The Ethernet adaptor according to claim 1, wherein said vertical portion of said L-shape body has an opening receiving a protruding portion in a front side of said male connector.

3. The Ethernet adaptor according to claim 1, wherein said female connector and said male connector belong to an RJ45 type.

4. The Ethernet adaptor according to claim 1, wherein rims of said upper cover and said lower cover respectively have snap-fit elements corresponding to each other, whereby said upper cover and said lower cover can be precisely snap-fitted to each other.

* * * * *